United States Patent
Matsumoto

(10) Patent No.: US 9,543,120 B2
(45) Date of Patent: Jan. 10, 2017

(54) BLANKING DEVICE FOR MULTI CHARGED PARTICLE BEAMS, AND MULTI CHARGED PARTICLE BEAM WRITING APPARATUS

(71) Applicant: NuFlare Technology, Inc., Yokohama (JP)

(72) Inventor: Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/870,842

(22) Filed: Sep. 30, 2015

(65) Prior Publication Data

US 2016/0111246 A1    Apr. 21, 2016

(30) Foreign Application Priority Data

Oct. 17, 2014   (JP) ................. 2014-213099

(51) Int. Cl.
*H01J 37/30*   (2006.01)
*H01J 37/317*  (2006.01)
*H01J 37/04*   (2006.01)

(52) U.S. Cl.
CPC .......... *H01J 37/3177* (2013.01); *H01J 37/045* (2013.01); *H01J 2237/0435* (2013.01)

(58) Field of Classification Search
CPC ............ H01J 37/045; H01J 37/147; H01J 37/1471–37/1478; H01J 37/3174; H01J 37/3177; H01J 2237/0435
See application file for complete search history.

(56) References Cited

U.S. PATENT DOCUMENTS

| | | | |
|---|---|---|---|
| 2003/0085360 A1* | 5/2003 | Parker | B82Y 10/00 250/396 R |
| 2005/0072941 A1 | 4/2005 | Tanimoto et al. | |
| 2005/0242302 A1* | 11/2005 | Platzgummer | B82Y 10/00 250/492.22 |
| 2008/0283767 A1* | 11/2008 | Platzgummer | B82Y 10/00 250/396 R |
| 2009/0200495 A1 | 8/2009 | Platzgummer | |
| 2012/0091318 A1* | 4/2012 | Wieland | B82Y 10/00 250/208.2 |

(Continued)

FOREIGN PATENT DOCUMENTS

| | | |
|---|---|---|
| JP | 2013-197469 | 9/2013 |
| JP | 2014-112639 | 6/2014 |

OTHER PUBLICATIONS

Korean Office Action dated Aug. 17, 2016, issued in Korean Patent Application Serial No. 10-2015-0140192 (with English translation).

*Primary Examiner* — David E Smith
(74) *Attorney, Agent, or Firm* — Oblon, McClelland, Maier & Neustadt, L.L.P.

(57) ABSTRACT

A blanking device for multi charged particle beams includes a plurality of individual blanking mechanisms configured to individually deflect a corresponding beam of multi charged particle beams so as to control ON/OFF of the corresponding beam, and a common blanking mechanism configured to include a plurality of electrode groups, each composed of facing electrodes, where an array pitch of a plurality of electrode groups is smaller than or equal to a pitch of the multi charged particle beams, and to collectively deflect the multi charged particle beams in order to control an exposure time.

8 Claims, 11 Drawing Sheets

(56) References Cited

U.S. PATENT DOCUMENTS

2013/0252145 A1* 9/2013 Matsumoto ......... H01J 37/3007
  430/30
2014/0124684 A1 5/2014 Matsumoto et al.

* cited by examiner

BLANKING DEVICE FOR MULTI CHARGED PARTICLE BEAMS, AND MULTI CHARGED PARTICLE BEAM WRITING APPARATUS

CROSS-REFERENCE TO RELATED APPLICATION

This application is based upon and claims the benefit of priority from the prior Japanese Patent Application No. 2014-213099 filed on Oct. 17, 2014 in Japan, the entire contents of which are incorporated herein by reference.

BACKGROUND OF THE INVENTION

Field of the Invention

Embodiments of the present invention relate generally to a blanking device for multi charged particle beams, and a multi charged particle beam writing apparatus, and more specifically, to a blanking device mounted in a multi-beam writing apparatus, for example.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. The electron beam writing technique, which intrinsically has excellent resolution, is used for writing or "drawing" a mask pattern on a mask blank with electron beams.

As an example employing the electron beam writing technique, a writing apparatus using multiple beams (multi-beams) can be cited. Compared with the case of writing a pattern by using a single electron beam, since it is possible to emit multiple beams at a time in multi-beam writing, the throughput can be greatly increased. For example, in a writing apparatus employing a multi-beam system, multi-beams are formed by letting portions of an electron beam emitted from an electron gun pass through a corresponding hole of a plurality of holes in the mask, each of the beams is blanking-controlled, and each unblocked beam is diminished by an optical system to reduce a mask image and deflected by a deflector so as to irradiate a desired position on a target object or "sample".

In the multi-beam writing, when performing highly precise writing, the dose of an individual beam is individually controlled by an irradiation time in order to give a specified dose onto each position on a target object. For highly accurately controlling the dose of each beam, it is necessary to carry out blanking control at high speed to perform a beam ON/OFF control. Conventionally, in a writing apparatus of a multi-beam system, a blanking control circuit for each beam is placed on a blanking plate where each blanking electrode of multi-beams is arranged. Controlling is independently performed for each beam. For example, a trigger signal for causing a beam to be ON is sent to control circuits of all the beams. In responsive to the trigger signal, the control, circuit of each beam applies a beam-ON voltage to an electrode, and simultaneously, starts counting the irradiation time period by a counter. Then, when the irradiation time has been completed, a beam-OFF voltage is applied. In performing such a control, a ten-bit control signal has been used, for example. However, since the space for placing a circuit on a blanking plate and the amount of current to be used are restricted, there is no other alternative but to have an uncomplicated circuit for the amount of information of control signals. Therefore, it has been difficult to build in a blanking circuit that can perform an operation of high speed and high precision. Further, installing a blanking control circuit for each beam on a blanking plate restricts narrowing the pitch of multi-beams. By contrast, when placing a control circuit for each beam outside the blanking plate and connecting them by wiring in order to secure a space for installing the circuit, since the wiring becomes long, there is a problem that crosstalk increases and writing precision degrades.

In order to solve the above problem, there is proposed a mechanism where, in addition to individual blanking electrodes for respective beams, deflectors are provided outside the ends of the multi-beams, in the latter part of the optical path, in a manner such that the deflectors sandwich the entire multi-beams so as to control the exposure time by collectively deflecting the entire multi-beams at high speed by the deflectors (e.g., refer to Japanese Patent Application Laid-open (JP-A) No. 2014-112639).

BRIEF SUMMARY OF THE INVENTION

According to one aspect of the present invention, a blanking device for multi charged particle beams includes a plurality of individual blanking mechanisms configured to individually deflect a corresponding beam of multi charged particle beams so as to control ON/OFF of the corresponding beam, and a common blanking mechanism configured to include a plurality of electrode groups, each composed of facing electrodes, where an array pitch of the plurality of electrode groups is smaller than or equal to a pitch of the multi charged particle beams, and to collectively deflect the multi charged particle beams in order to control an exposure time.

According to another aspect of the present invention, a multi charged particle beam writing apparatus includes a stage configured to mount a target object thereon and to be continuously movable, an emitter configured to emit a charged particle beam, an aperture member, in which a plurality of openings are formed, configured to form multi beams by making a region including a whole of the plurality of openings irradiated by the charged particle beam and by letting portions of the charged particle beam individually pass through a corresponding one of the plurality of openings, a plurality of individual blanking mechanisms configured to individually deflect a corresponding beam of the multi beams in order to control ON/OFF the corresponding beam, a common blanking mechanism configured to include a plurality of electrode groups, each composed of facing electrodes, where an array pitch of the plurality of electrode groups is smaller than or equal to a pitch of the multi beams, and to collectively deflect the multi beams in order to control an exposure time, and a limiting aperture member configured to block each beam having been deflected to be in an off state by at least one of the plurality of individual blanking mechanisms and the common blanking mechanism.

DETAILED DESCRIPTION OF THE INVENTION

With respect to a deflector configuration where, in addition to individual blanking electrodes for respective beams, a pair of electrodes is arranged outside the array of multi-beams, in the latter part of the optical path of the multi-beams, in a manner such that the electrodes sandwich the entire multi-beams, it is necessary to have long length electrodes because, since the size of the entire multi-beams is larger than that of each beam, the distance between the electrodes of the deflectors is long and therefore the electric field between the electrodes is weak. However, if the electrode capacitance becomes large because of having long length electrodes, the settling time of an amplifier for applying a deflection voltage to each of the deflectors becomes long. Thus, a limitation occurs in high-speed deflection.

Then, in a first embodiment, there will be described a blanking device capable of deflecting multi-beams at high speed and a multi charged particle beam writing apparatus.

According to the first embodiment described below, there will be described a configuration in which an electron beam is used as an example of a charged particle beam. The charged particle beam is not limited to the electron beam, and other charged particle beam such as an ion beam may also be used.

First Embodiment

Figure 1:
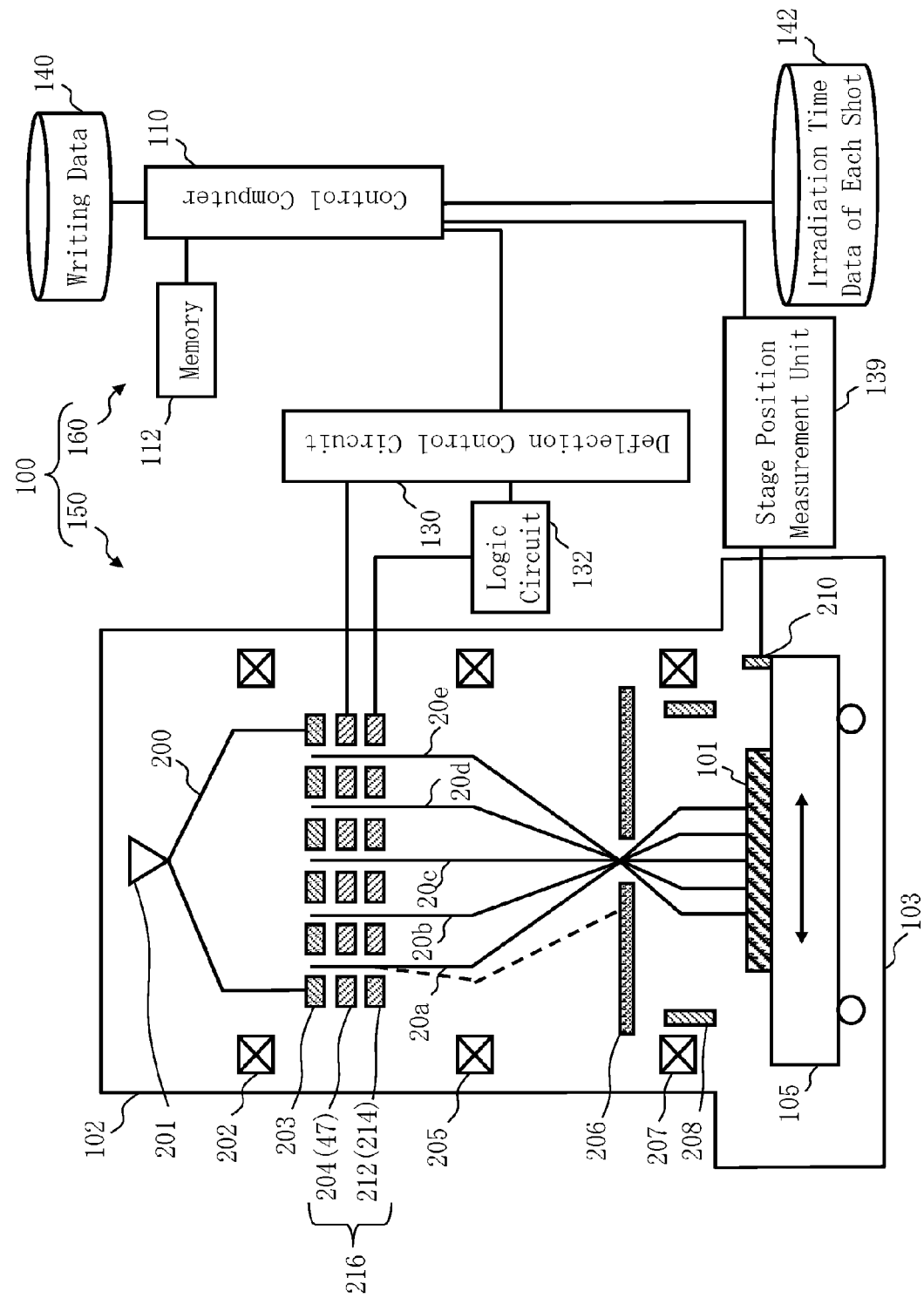
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun 201, an illumination lens 202, a multi beam forming plate 203, a blanking device 216, a reducing lens 205, a limiting aperture member 206, an objective lens 207, and a deflector 208. The blanking device 216 includes an individual blanking plate 204 and a common blanking plate 212. On the individual blanking plate 204, a plurality of individual blanking mechanisms 47 are arranged. On the common blanking plate 212, a common blanking mechanism 214 is arranged.

In the writing chamber 103, an XY stage 105 is arranged. On the XY stage 105, there is arranged a target object or "sample" 101 such as a mask serving as a writing target substrate when writing is performed. For example, the target object 101 is an exposure mask used for manufacturing semiconductor devices, or is a semiconductor substrate (silicon wafer) on which semiconductor elements are formed. Moreover, the target object 101 may be, for example, a mask blank on which resist has been coated and no pattern has yet been written. On the XY stage 105, a mirror 210 for measuring the position of the XY stage 105 is arranged. The inside of the electron optical column 102 and the writing chamber 103 is maintained to be in a vacuum state during the writing operation since the internal gas is exhausted by a vacuum pump (not shown).

The control unit 160 includes a control computer 110, a memory 112, a deflection control circuit 130, a logic circuit 132, a stage position measurement unit 139, and storage devices 140 and 142 such as magnetic disk drives. The control computer 110, memory 112, deflection control circuit 130, stage position measurement unit 139, and storage devices 140 and 142 are connected with each other through a bus (not shown). Writing data is input into the storage device 140 from the outside, and stored therein. The control unit 160 is arranged outside the electron optical column 102 and the writing chamber 103, that is, placed in the atmosphere environment.

FIG. 1 shows a configuration necessary for explaining the first embodiment. Other configuration elements generally necessary for the writing apparatus 100 may also be included.

Figure 2A:
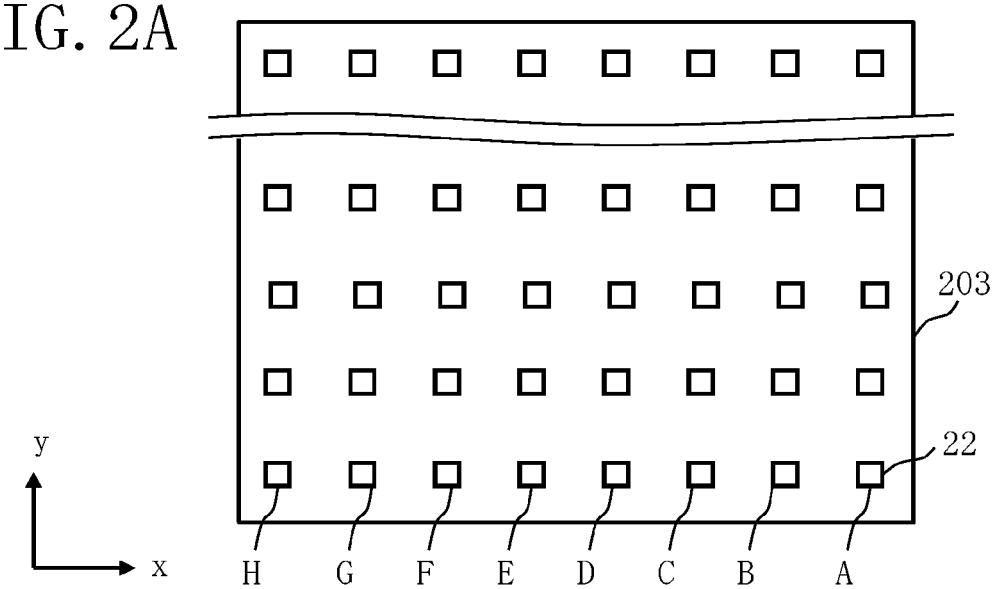
FIGS. 2A and 2B are conceptual diagrams each showing a configuration of a multi-beam forming plate according to the first embodiment.
Figure 2B:
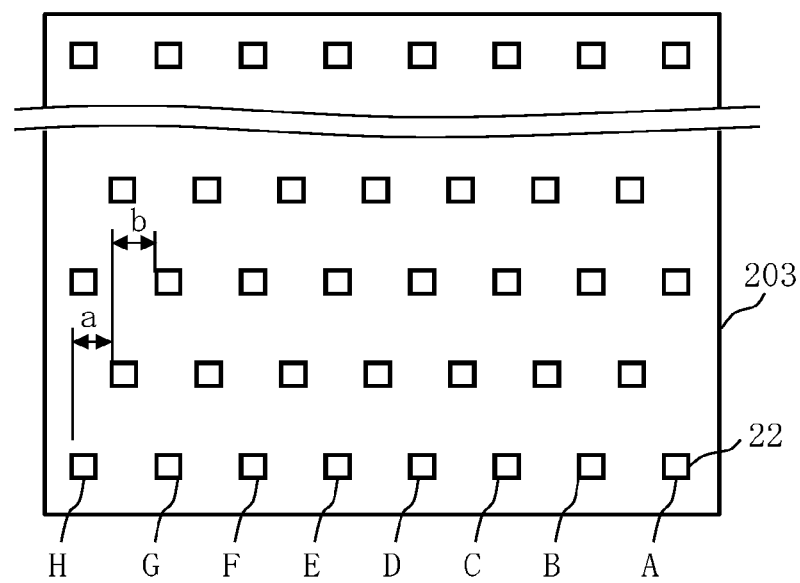

FIGS. 2A and 2B are conceptual diagrams each showing an example of the configuration of a multi-beam forming plate according to the first embodiment. As shown in FIG. 2A, holes (openings) 22 of m rows long (y direction) and n columns wide (x direction) (m≥2, n≥2) are formed, like a matrix, in the multi-beam forming plate 203 at a predetermined arrangement pitch. In FIG. 2A, for example, holes 22 of 512 (rows)×8 (columns) are formed. Each of the holes 22 is a quadrangle of the same dimensional shape. Alternatively, each of the holes 22 can be a circle of the same circumference. Here, there is shown an example in which each of the rows arrayed in the y direction has eight holes 22 from A to H in the x direction. Multi-beams 20 are formed by letting portions of an electron beam 200 individually pass through a corresponding hole of a plurality of holes 22. The case in which the holes 22 of two or more rows and columns are arranged in both the x and the y directions is shown here, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. Moreover, the method of arranging the holes 22 is not limited to the case of FIG. 2A where holes are arranged like a grid in the length and width directions. For example, as shown in FIG. 2B, as to the first and second rows arrayed in the length direction (y direction), each hole in the first row and each hole in the second row may be mutually displaced in the width direction (x direction) by a dimension "a". Similarly, as to the second and third rows arrayed in the length direction (y direction), each hole in the second row and each hole in the third row may be mutually displaced in the width direction (x direction) by a dimension "b", for example.

Figure 3:
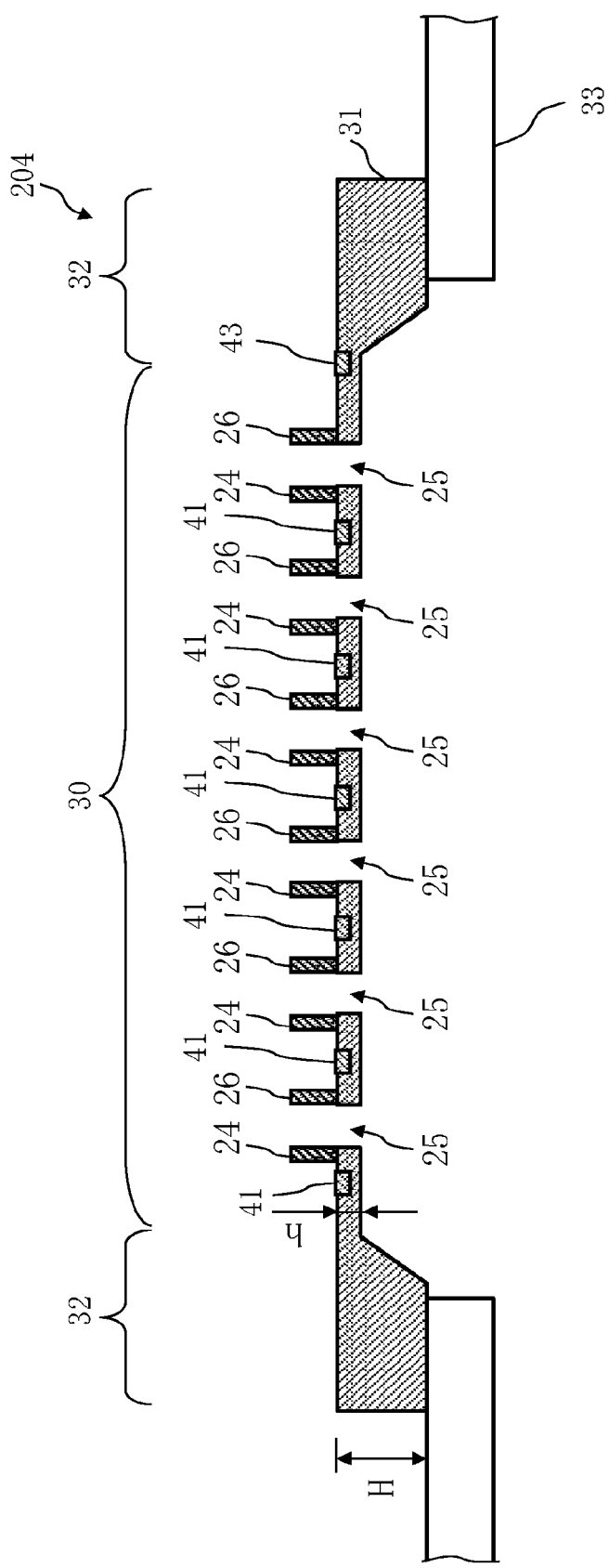
FIG. 3 is a conceptual diagram showing a configuration of an individual blanking plate according to the first embodiment.
Figure 4:
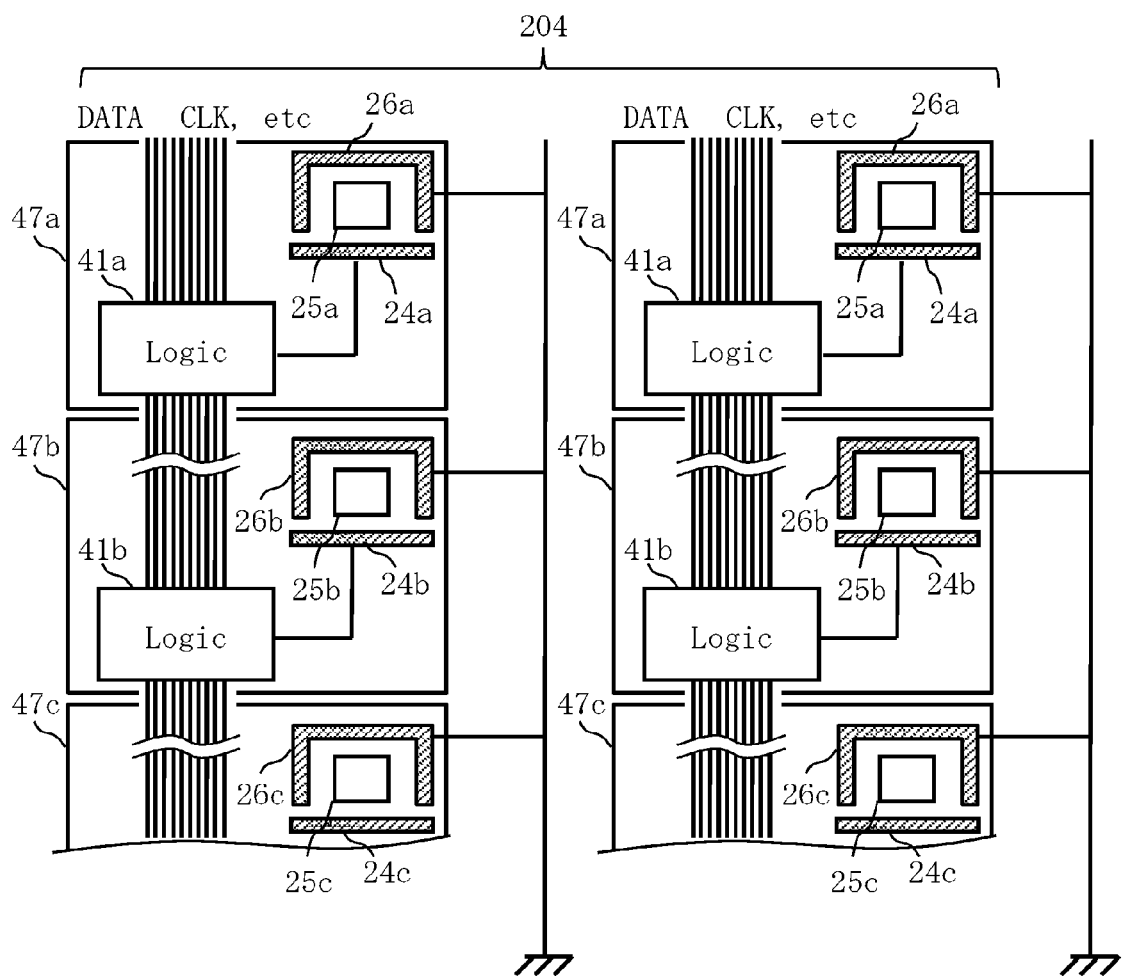
FIG. 4 is a top view conceptual diagram showing an individual blanking plate according to the first embodiment.

FIG. 3 is a conceptual diagram showing a configuration of an individual blanking plate according to the first embodiment. FIG. 4 is a top view conceptual diagram showing an individual blanking plate according to the first embodiment. In FIGS. 3 and 4, for the sake of convenience, the positional relation of a control electrode 24 and an counter electrode 26 and the positional relation of a control circuit 41 and a control circuit 43 are not in accordance with each other. With regard to the configuration of the blanking plate 204, as shown in FIG. 3, a semiconductor substrate 31 made of silicon, etc. is placed on a support table 33. The central part of the substrate 31 is shaved from the back side and processed to be a membrane region 30 (first region) whose thin film thickness is h. The circumference surrounding the membrane region 30 is a circumference region 32 (second region) whose thick film thickness is H. The upper surface of the membrane region 30 and the upper surface of the circumference region 32 are formed to have equal height positions, or substantially equal height positions. At the backside of the circumference region 32, the substrate 31 is supported to be on the support table 33. The central part of the support table 33 is open, and the position of the membrane region 30 is located in the opening part of the support table 33.

In the membrane region 30, passage holes 25 (openings), through each of which a corresponding one of multi beams passes, are formed at the positions corresponding to the holes 22 of the multi-beam forming plate 203 shown in FIG. 2A or 2B. Then, as shown in FIGS. 3 and 4, pairs of the control electrodes 24 and the counter electrodes 26 (blanker: blanking deflector) for blanking deflection are arranged in the membrane region 30, where each of the pairs is close to a corresponding passage hole 25 in a manner such that the control electrode 24 and the counter electrode 26 are at opposite sides of the corresponding passage hole 25. Moreover, close to each passage hole 25 in the membrane region 30, there is arranged the control circuit 41 (logic circuit) which applies a deflection voltage to the control electrode 24 for each passage hole 25. The counter electrodes 26 each for each beam is earthed (grounded). The positions of a plurality of passage holes 25 correspond to passage positions of the multi-beams 20. Therefore, when the positional relation of the holes 22 between rows is shifted as shown in FIG. 2B, it goes without saying that the positions of a plurality of passes holes 25 are also shifted according to the shift of the holes 22.

Moreover, as shown in FIG. 4, for example, a one-bit line for a control signal is connected to each control circuit 41. In addition to the one-bit line, a clock signal line and a line for power supply are connected to each control circuit 41. An individual blanking mechanism 47 composed of the control electrode 24, the counter electrode 26, and the control circuit 41 is configured for each of the multi beams. In the case of FIG. 3, the control electrode 24, the counter electrode 26, and the control circuit 41 are arranged in the membrane region 30 having a thin film thickness. However, it is not limited thereto.

The electron beam 20 passing through a corresponding passage hole 25 is deflected by the voltage independently applied to the two electrodes 24 and 26 being a pair. Blanking control is performed by this deflection. In other words, each pair of the control electrode 24 and the counter electrode 26 provides a blanking deflection of a corresponding beam of the multi-beams each having passed through a corresponding one of a plurality of holes 22 (openings) of the multi-beam forming plate 203. Thus, a plurality of individual blanking mechanisms 47 each deflects a corresponding one of the multi-beams 20 so as to control ON/OFF of the beam are mounted on the blanking plate 204.

Figure 5:
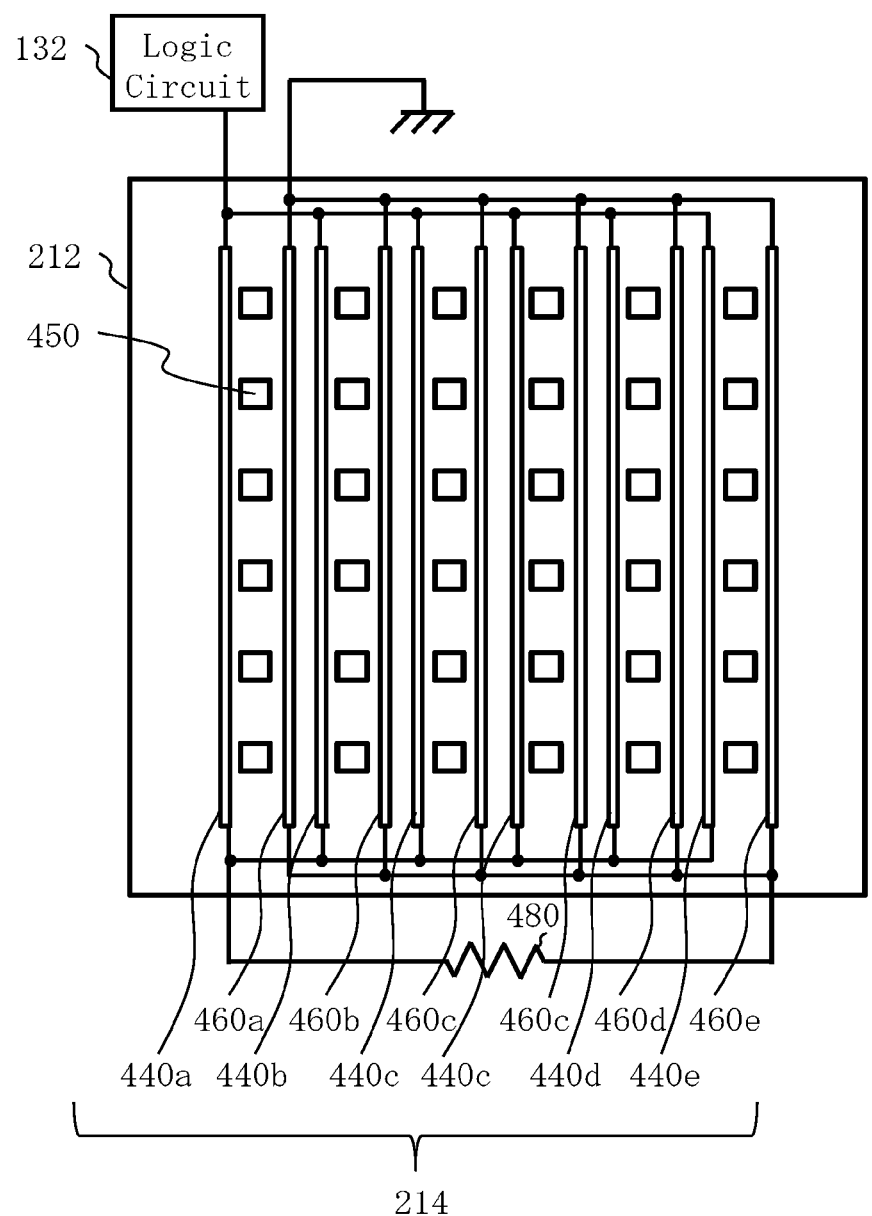
FIG. 5 is a top view conceptual diagram showing a configuration of a common blanking plate according to the first embodiment.

FIG. 5 is a top view conceptual diagram showing a configuration of a common blanking plate according to the first embodiment. Similarly to the individual blanking plate 204 shown in FIG. 3, with regard to the configuration of the common blanking plate 212, a substrate made of silicon, etc. and having lines is placed on a support table. The central part of the substrate is shaved from the back side and processed to be a membrane region having a thin film thickness. The circumference surrounding the membrane region is a circumference region whose thick film thickness is H. At the backside of the circumference region, the substrate of the common blanking plate 212 is supported to be on the support table. The central part of the support table is open, and the position of the membrane region is located in the opening part of the support table.

In the membrane region of the common blanking plate 212, passage holes 450 (openings), through each of which a corresponding one of multi beams passes, are formed at the positions corresponding to the passing holes 25 on the individual blanking plate 204 shown in FIGS. 3 and 4. The positions of a plurality of passage holes 450 correspond to passage positions of the multi-beams 20. Therefore, when the positional relation of the holes 22 between rows is shifted as shown in FIG. 2B, it goes without saying that the positions of a plurality of passes holes 450 are also shifted according to the shift of the holes 22. The multi-beams formed when the electron beam 200 passes through the holes 22 shown in FIG. 2A or 2B are arranged in two dimensions in a matrix on a plane perpendicular to the direction of radiation. Moreover, on the common blanking plate 212, there are arranged a plurality of electrode groups each composed of the control electrode 440 and the counter electrode 460 at the opposite sides of the passage hole 450. Thus, the common blanking mechanism 214 is configured by a plurality of electrode groups (a plurality of pairs each composed of a control electrode 440 and a counter electrode 460). In other words, the common blanking mechanism 214 includes the common blanking plate 212 where a plurality of passage holes 450 (openings) are formed in two dimensions in a matrix, through each of which a corresponding one of multi beams passes. With respect to rows of a plurality of passage holes 450 or columns of a plurality of passage holes 450, each of a plurality of electrode groups is arranged such that electrodes in each group sandwich the row or column concerned. To be described later, the common blanking mechanism 214 collectively deflects the multi-beams 20, and controls an exposure time. Therefore, it is not necessary to arrange an electrode group for each beam. According to the first embodiment, each electrode group is arranged for each row or column of the multi-beams 20. In the case of FIG. 5, one electrode group made of a pair of the control electrode 440 and the counter electrode 460 is arranged for the passage holes 450 arrayed in each of columns in a manner such that the two electrodes are at the both sides of the column concerned. For example, a group of a control electrode 440a and a counter electrode 460a is arranged in the first column from the left, and a group of a control electrode 440b and a counter electrode 460b is arranged in the second column from the left. Thus, each electrode group is composed of the control electrode 440 and the counter electrode 460 which is grounded. One control electrode 440 is arranged for a plurality of passage holes 450 (openings) in each row or column, and, similarly, one counter electrode 460 is arranged for a plurality of passage holes 450 (openings) in each row or column. Beams of one row or column are collectively deflected by one group, composed of the control electrode 440 and the counter electrode 460, for the one row or column concerned. In other words, in the multi beams, beams which individually pass through a corresponding one of a plurality of passage holes 450 (openings) in one row or column are collectively deflected by one electrode group of the control electrode 440 and the counter electrode 460. Electrode groups each composed of the control electrode 440 and the counter electrode 460 are arranged at intervals of beam pitches of the multi-beams 20.

Figure 6:
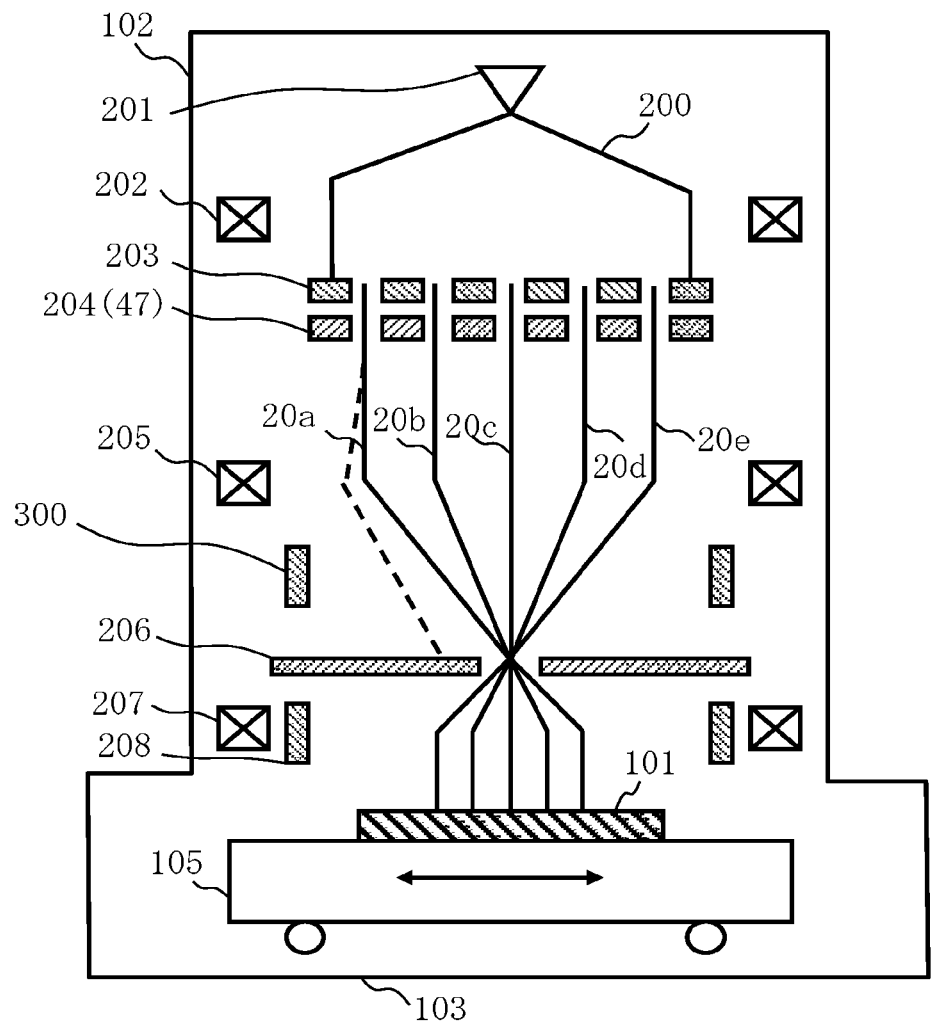
FIG. 6 is a conceptual diagram showing a configuration of a writing apparatus according to a comparative example of the first embodiment.

FIG. 6 is a conceptual diagram showing a configuration of a writing apparatus according to a comparative example of the first embodiment. The writing unit 150 of FIG. 6 is the same as that of FIG. 1 except that a deflector 300 is arranged instead of the common blanking plate 212 of FIG. 1. In the comparative example shown in FIG. 6, a pair of electrodes of the deflector 300 is arranged outside the ends of the multi-beams in a manner such that the electrodes sandwich the entire multi-beams. With this structure, the distance between the electrodes of the deflector 300 inevitably needs to be long in order to sandwich the entire multi-beams. Therefore, the electric field between the electrodes in the case of performing a common blanking control becomes weak. On the other hand, according to the first embodiment, as described above, since the common blanking plate 212 in which each pair of electrodes sandwiches each beam group in the multi-beams is used, the distance between the electrodes is shorter than the case of deflector arranged in a manner such that a pair of electrodes sandwiches the entire multi-beams. Therefore, a stronger deflection electric field can be obtained even when the same voltage is given to the electrode, which enables the length of the electrode to be shortened within a range that deflection sensitivity serves sufficiently. Then, impedance of each electrode can be decreased by shortening the dimension of the electrode. As a result, the settling time of the deflection electric field can be reduced. Accordingly, a high-speed deflection for blanking can be performed. The beam pitch is defined by the distance between adjacent beams of the multi-beams 20. In the case of FIG. 5, the arrangement pitch of the passage holes 450 is the same size as the beam pitch. The common blanking mechanism 214 is arranged between the blanking plate 204, on which a plurality of individual blanking mechanisms 47 are mounted, and the limiting aperture member 206.

As shown in FIG. 5, one end of each of the control electrodes 440 of the common blanking mechanism 214 is connected in parallel to the logic circuit 132, and the other end of each of the control electrodes 440 is connected in parallel to one end of a termination resistance 480. Thus, the control electrodes 440 of respective electrode groups are arranged to be electrically connected with each other. Moreover, one end of each counter electrode 460 is grounded, and the other end of each counter electrode 460 is connected in parallel to the other end of the termination resistance 480. Thus, the counter electrodes 460 of respective electrode groups are arranged to be electrically connected with each other. By installing the termination resistance 480, settling can be performed in high speed. Since the termination resistance 480 generates heat, it is preferably arranged outside the substrate of the common blanking plate 212. As described above, in the case of FIG. 5, since the control electrodes 440 of the common blanking mechanism 214 are connected in parallel, the same deflection voltage from the logic circuit 132 is applied simultaneously to each of them. Therefore, the entire multi-beams is collectively deflected simultaneously.

The deflection direction of the common blanking mechanism is defined not to disturb the deflection direction of the blanking aperture 47. For example, deflection directions of them are defined to be the same.

Figure 7:
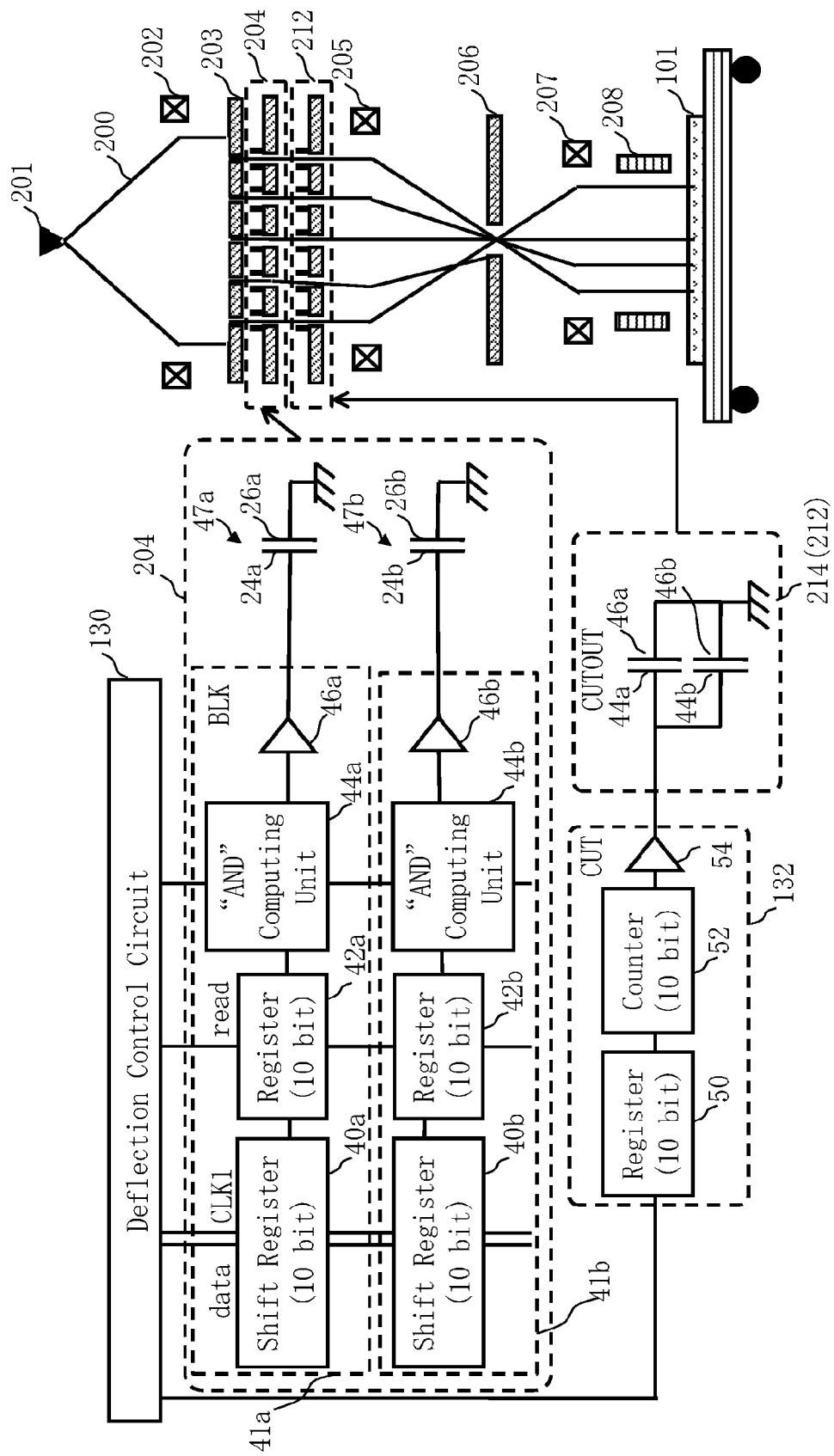
FIG. 7 is a schematic diagram showing an internal configuration of an individual blanking control circuit and a common blanking control circuit according to the first embodiment.

FIG. 7 is a schematic diagram showing the internal configuration of an individual blanking control circuit and a common blanking control circuit according to the first embodiment. As shown in FIG. 7, a shift register 40, a register 42, and an AND computing unit 44 (logical product computing unit) are arranged in each logic circuit 41 for controlling individual blanking arranged in the blanking plate 204 in the body of the writing apparatus 100. The AND computing unit 44 is used for compulsorily making all the individual blanking OFF when a problem occurs in the register operation, for example, but it may be omitted in the first embodiment. According to the first embodiment, a one-bit control signal is used for individual blanking control for each beam, which has conventionally been controlled by, for example, a ten-bit control signal. That is, a one-bit control signal is input/output into/from the shift register 40, register 42, and AND computing unit 44. Since the amount of information of a control signal is small, the installation area of the control circuit can be made small. In other words, even when a logic circuit is arranged on the blanking plate 204 whose installation space is small, more beams can be arranged at a smaller beam pitch. This increases the amount of current passing the blanking plate, and therefore, the writing throughput can be improved. Although a one-bit control signal is used in this case, it is also preferable to use a two or more bit signal.

Moreover, a register 50, a counter 52, and an amplifier 54 (drive amplifier) are arranged in the logic circuit 132 for common blanking. These do not simultaneously perform several different controls, and therefore, it is sufficient to use one circuit to perform ON/OFF control. Accordingly, even when arranging a circuit for a high speed response, no problem occurs with respect to the restriction on the installation space and the current to be used in the circuit. Therefore, the amplifier 54 operates at very high speed compared with an amplifier 46 realizable on the blanking plate 204. The amplifier 54 is controlled by a ten-bit control signal, for example. That is, for example, a ten-bit control signal is input/output into/from the register 50 and the counter 52. Moreover, according to the first embodiment, the amplifier 54 which drives the common blanking mechanism 214 is arranged outside the electron optical column 102 and the writing chamber 103, that is, placed in the atmosphere environment. Thereby, the degree of freedom of cooling can be increased compared with the case of arranged in the electron optical column 102. Moreover, it also leads to decrease the amount of heat radiation in the electron optical column 102.

According to the first embodiment, as described above, blanking control of each beam is performed by using both the beam ON/OFF control by each logic circuit 41 for individual blanking control and the beam ON/OFF control by the logic circuit 132 for common blanking control that collectively performs blanking control of the entire multi beams.

Figure 8:
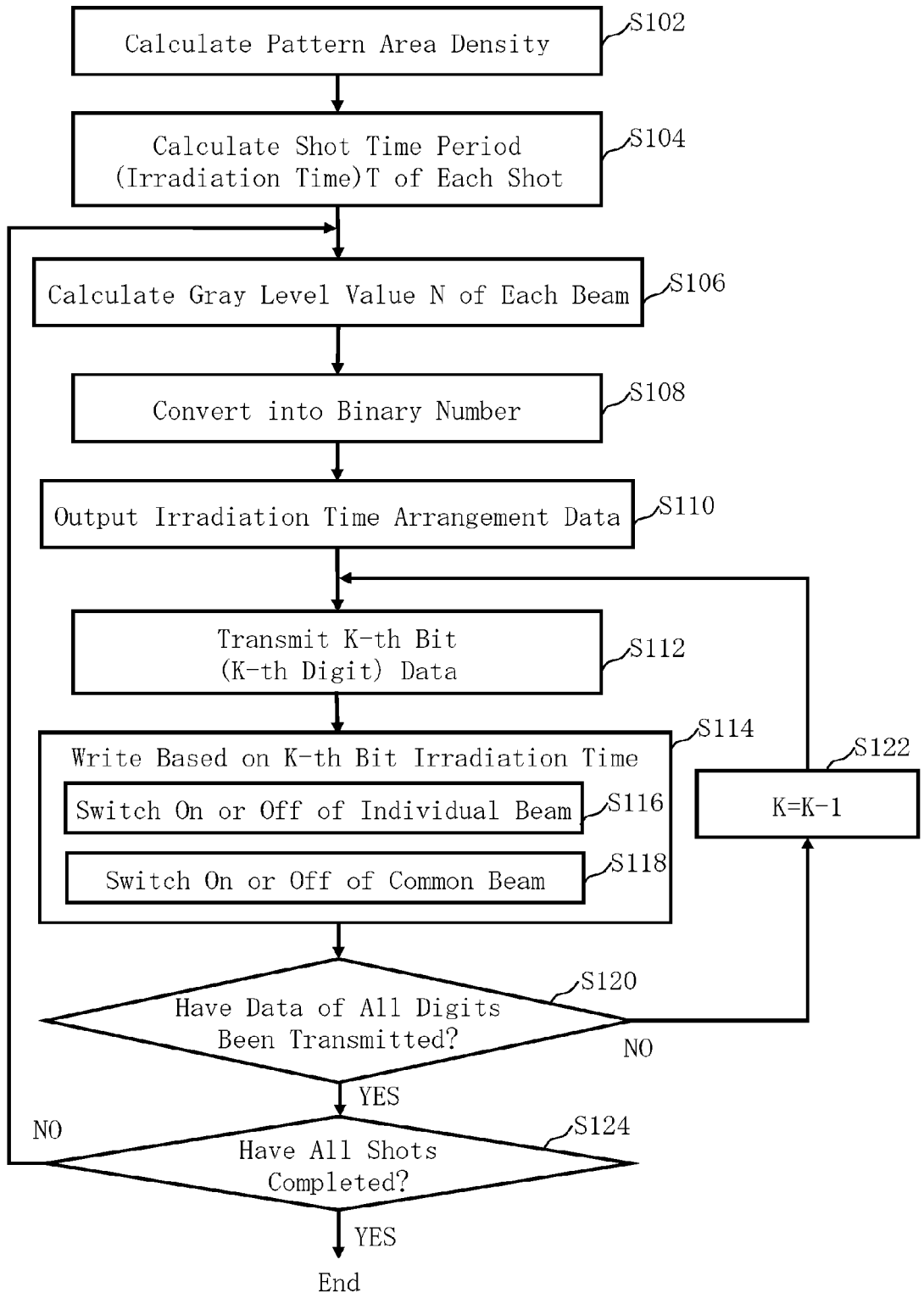
FIG. 8 is a flowchart showing main steps of a writing method according to the first embodiment.

FIG. 8 is a flowchart showing main steps of a writing method according to the first embodiment. As shown in FIG. 8, a series of steps: a pattern area density calculation step (S102), a shot time period (irradiation time) T calculation step (S104), a gray level value N calculation step (S106), a conversion to binary number step (S108), an irradiation time arrangement data output step (S110), a target digit data transmission step (S112), a writing step (S114) based on irradiation time of a target digit, a determination step (S120), a digit change step (S122), and a determination step (S124) are executed. The writing step (S114) based on irradiation time of a target digit executes, as its internal steps, a series of steps: an individual beam ON/OFF switching step (S116) and a common beam ON/OFF switching step (S118).

In the pattern area density calculation step (S102), a pattern area density calculation unit (not shown) in the control computer 110 reads writing data from the storage device 140, and calculates the area density of a pattern arranged in the writing region of the target object 101 or in each mesh region of a plurality of mesh regions obtained by virtually dividing a chip region to be written into meshes. For example, the writing region of the target object 101 or a chip region to be written is divided into strip-shaped stripe regions each having a predetermined width. Then, each stripe region is virtually divided into a plurality of mesh regions described above. It is preferable that the size of a mesh region is, for example, a beam size, or smaller than a beam size. For example, the size of a mesh region is preferably about 10 nm. The area density calculation unit 60 reads corresponding writing data from the storage device 140 for each stripe region, and assigns a plurality of figure patterns defined in the writing data to a mesh region, for example. Then, the area density of a figure pattern arranged in each mesh region is to be calculated.

In the shot time period (irradiation time) T calculation step (S104), an irradiation time calculation unit (not shown) in the control computer 110 calculates an irradiation time T (hereinafter will also be called a shot time period or an exposure time) of the electron beam per shot, for each predetermined sized mesh region. When performing multiple writing, an irradiation time T of the electron beam per shot in each hierarchy (or "each writing process") of the multiple writing should be calculated. It is preferable to obtain an irradiation time T, being a reference, to be in proportion to a calculated pattern area density. Moreover, it is preferable that an irradiation time T to be finally calculated is a time equivalent to a dose after correction, that is a dose having been corrected with respect to a dimension change amount for a phenomenon causing dimension variations, such as a proximity effect, a fogging effect, or a loading effect not shown. The size of a plurality of mesh regions for defining an irradiation time T and the size of a plurality of mesh regions where a pattern area density is defined may be the same size or different sizes. When they are different sizes, each irradiation time T is calculated after interpolating an area density by linear interpolation, etc. The irradiation time T for each mesh region is defined in an irradiation time map, and the irradiation time map is stored in the storage device 142, for example.

In the gray level value N calculation step (S106), a gray level value calculation unit (not shown) in the control computer 110 calculates a gray level value N, being an integer, in the case of defining the irradiation time T for each mesh region, defined in the irradiation time map, by using a predetermined quantization unit $\Delta$. The irradiation time T is defined by the following equation (1).

$$T = \Delta N \quad (1)$$

Therefore, the gray level value N is defined as an integer value obtained by dividing the irradiation time T by a quantization unit $\Delta$. The quantization unit $\Delta$ can be variously set, and, for example, it can be defined by 1 ns (nanosecond), etc. It is preferable that a value of 1 to 10 ns, for example, is used as the quantization unit $\Delta$. $\Delta$ indicates a quantization unit for controlling, such as a clock period used in the case of performing control by a counter.

In the conversion to binary number step (S108), a bit conversion unit (not shown) in the control computer 110 converts, for each shot, the irradiation time (in this case, a gray level value N) of each of multi beams into a predetermined n-digit binary value. For example, when N=50, since it is $50=2^1+2^4+2^5$, if converting into a 10-digit binary value, it becomes "0000110010". For example, if N=500, it is "0111110100". For example, if N=700, it is "1010111100". For example, if N=1023, it is "1111111111". For each shot, the irradiation time of each beam is equivalent to an irradiation time defined for a mesh region to be irradiated by each beam concerned. Thereby, the irradiation time T is defined by the following equation (2).

$$T = \Delta \sum_{k=0}^{n-1} a_k 2^k \quad (2)$$

$a_k$ indicates a value (1 or 0) of each digit in the case defining the gray level value N by a binary number. Although it is sufficient for n, being the number of digits, to be two or more, preferably it should be four or more digits, and more preferably, it should be eight or more digits.

According to the first embodiment, for each shot of beams, irradiation of each beam of each shot concerned is divided into irradiation of n times, where n indicates the number of digits. The irradiation of n times is equivalent to a combination of irradiations, where each irradiation is based on an irradiation time equivalent to each digit obtained by defining a converted binary number of a corresponding digit in decimal notation. In other words, one shot is divided into a plurality of irradiation steps of irradiation time periods of $\Delta a_0 2^0$, $\Delta a_1 2^1$, ..., $\Delta a_k 2^k$, ..., $\Delta a_{n-1} 2^{n-1}$. In the case of n=10, n being the number of digits, one shot is divided into irradiation steps of 10 times. The divided irradiation steps of 10 times are performed in succession, with being superposed at the same position. In other words, successive superposed irradiation is performed on the same position. When each beam irradiation of the divided irradiation steps of 10 times has been finished, it becomes a maximum irradiation time (maximum exposure time), which is equivalent to the case of N=1023. Thus, in the divided irradiation steps of n times, a desired irradiation time (exposure time) of each beam is obtained by adjustment by selectively combining a step of irradiating a beam and a step of not irradiating a beam.

For example, in the case of n=10, with n being the number of digits, if N=700, the irradiation time of the tenth digit (the tenth bit) is $\Delta \times 512$. The irradiation time of the ninth digit (the ninth bit) is $\Delta \times 0=0$. The irradiation time of the eighth digit (the eighth bit) is $\Delta \times 128$. The irradiation time of the seventh digit (the seventh bit) is $\Delta \times 0=0$. The irradiation time of the sixth digit (the sixth bit) is $\Delta \times 32$. The irradiation time of the fifth digit (the fifth bit) is $\Delta \times 16$. The irradiation time of the fourth digit (the fourth bit) is $\Delta \times 8$. The irradiation time of the third digit (the third bit) is $\Delta \times 4$. The irradiation time of the second digit (the second bit) is $\Delta \times 0=0$. The irradiation time of the first digit (the first bit) is $\Delta \times 0=0$.

For example, in the case of performing irradiation in order from the largest digit, if $\Delta=1$ ns, the first irradiation step is 512 ns (beam ON) irradiation. The second irradiation step is 0 ns (beam OFF) irradiation. The third irradiation step is 128 ns (beam ON) irradiation. The fourth irradiation step is 0 ns (beam OFF) irradiation. The fifth irradiation step is 32 ns (beam ON) irradiation. The sixth irradiation step is 16 ns (beam ON) irradiation. The seventh irradiation step is 8 ns (beam ON) irradiation. The eighth irradiation step is 4 ns (beam ON) irradiation. The ninth irradiation step is 0 ns (beam OFF) irradiation. The tenth irradiation step is 0 ns (beam OFF) irradiation.

The irradiation time data of each shot, which has been generated as described above, is stored in the storage device 142.

As described above, according to the first embodiment, for each shot of beams, irradiation of each beam of each shot concerned is divided into irradiation of n times, where n indicates the number of digits. The irradiation of n times is equivalent to a combination of irradiations, where each irradiation is based on an irradiation time equivalent to each digit obtained by defining a converted binary number of a corresponding digit in decimal notation. Then, as will be described later, the target object 101 is irradiated in order by a beam of irradiation time corresponding to each digit.

In the irradiation time arrangement data output step (S110), a transmission processing unit (not shown) in the control computer outputs, for each beam shot, irradiation time arrangement data having been converted into binary digit data to the deflection control circuit 130.

In the target digit data transmission step (S212), the deflection control circuit 130 outputs, for each shot, irradiation time arrangement data to the logic circuit 41 for each beam. Moreover, synchronized with this, the deflection control circuit 130 outputs timing data of each irradiation step to the logic circuit 132 for common blanking.

According to the first embodiment, as shown in FIG. 7, since the shift register 40 is used for the logic circuit 41, the deflection control circuit 130 transmits data of the same bit (the same number of digits) to each logic circuit 41 of the blanking plate 204 in the order of beam arrangement (or in the order of identification number). Moreover, a clock signal (CLK1) for synchronization, a read signal (read) for data read-out, and agate signal (BLK) are output.

Next, in response to an input of a read signal (read), the register 42 of each beam reads the data of the k-th bit (k-th digit) of each beam from the shift register 40. When inputting the data of the k-th bit (k-th digit), the individual register 42 of each beam outputs, based on the data, an ON/OFF signal to the AND computing unit 44. If the data of the k-th bit (k-th digit) is "1", an ON signal is output, and if it is "0", an OFF signal is output. Then, when the BLK signal is an ON signal and the signal of the register 42 is ON, the AND computing unit 44 outputs an ON signal to the amplifier 46, and the amplifier 46 applies an ON voltage to the electrode 24 of the individual blanking deflector. In the case other than the above, the AND computing unit 44 outputs an OFF signal to the amplifier 46, and the amplifier 46 applies an OFF voltage to the electrode 24 of the individual blanking deflector.

While the data of the k-th bit (k-th digit) is being processed, the deflection control circuit 130 transmits the data of the (k−1)th bit ((k−1)th digit) to each logic circuit 41 of the blanking plate 204 in the order of beam arrangement (or in the order of identification number). Based on the read signal of the (k−1)th bit ((k−1)th digit), the register 42 of each beam reads data of the (k−1)th bit ((k−1)th digit) of each beam, from the shift register 40. Similarly, it should go to the data processing of the first bit (the first digit).

The AND computing unit 44 shown in FIG. 7 may be omitted. However, it is effective in that a beam can be controlled to be off by the AND computing unit 44 in the case of not being able to make the beam off because of a trouble of elements of the logic circuit 41. Although a data transmission channel for one bit where the shift registers are arranged in series is used in FIG. 7, it is also effective to provide a plurality of parallel transmission channels in order to improve the speed of transmission.

In the writing step (S114) based on an irradiation time of a target digit, for each beam shot, writing is performed based on the irradiation time of a target digit (for example, the k-th bit (k-th digit)) in irradiation having been divided into a plurality of irradiation steps.

Figure 9:
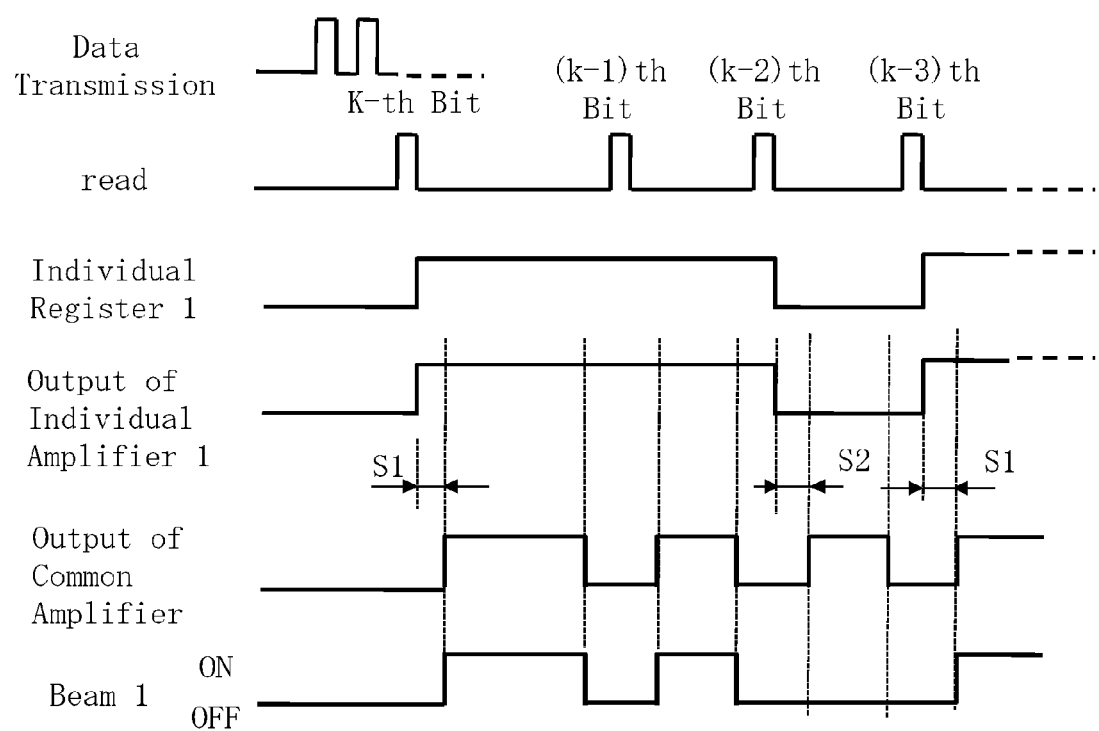
FIG. 9 is a flowchart showing a beam ON/OFF switching operation with respect to a part of an irradiation step during one shot according to the first embodiment.

FIG. 9 is a flowchart showing a beam ON/OFF switching operation with respect to a part of an irradiation step during one shot according to the first embodiment. FIG. 9 shows one beam (beam 1) in multi beams. In the example of FIG. 9, the irradiation time arrangement data of the k-th bit (k-th digit) to the (k−3)th bit ((k−3)th digit) of the beam 1 is represented by "1101". First, in response to an input of a read signal of the k-th bit (k-th digit), the individual register 42 (individual register 1) outputs an ON/OFF signal, based on the stored data of the k-th bit (k-th digit). In the case of FIG. 9, an ON signal is output. According to the first embodiment, since a one-bit signal is used, the data output of the individual register 42 is maintained until the (k−1)th bit ((k−1)th digit) data is read.

Since the data of the k-th bit (k-th digit) is data indicating ON, the individual amplifier 46 (individual amplifier 1) outputs an ON voltage to be applied to the blanking electrode 24 for the beam 1. On the other hand, in the logic circuit 132 for common blanking, ON or OFF is switched depending upon timing data of ten bits of each irradiation step. In the common blanking mechanism, an ON signal is output during the irradiation time of each irradiation step. For example, if $\Delta=1$ ns, the irradiation time of the first irradiation step (for example, the tenth digit (tenth bit)) is $\Delta \times 512=512$ ns. The irradiation time of the second irradiation step (for example, the ninth digit (ninth bit)) is $\Delta \times 256=256$ ns. The irradiation time of the third irradiation step (for example, the eighth digit (eighth bit)) is $\Delta \times 128=128$ ns. Similarly, an ON signal is output during the irradiation time of each digit (each bit), hereinafter. In the logic circuit 132, when timing data of each irradiation step is input into the register 50, controlling is performed such that the register 50 outputs data indicating ON of the k-th digit (k-th bit), the counter 52 counts the irradiation time of the k-th digit (k-th bit), and it becomes OFF after the irradiation time has passed.

In the common blanking mechanism, compared with ON/OFF switching of the individual blanking mechanism, ON/OFF switching is performed after the voltage stabilization time (settling time) S1 or S2 of the amplifier 46 has passed. In the example of FIG. 9, after the individual amplifier 1 has become ON and the settling time S1 of the individual amplifier 1 at the time of switching from OFF to ON has passed, the common amplifier becomes ON. Thereby, beam irradiation at an unstable voltage at the time of rise of the individual amplifier 1 can be avoided. Then, the common amplifier becomes OFF after the irradiation time of the k-th digit (k-th bit) has passed. Consequently, in the case of both the individual amplifier and the common amplifier being ON, an actual beam becomes ON to irradiate the target object 101. Therefore, it is controlled such that the ON time period of the common amplifier is the irradiation time of the actual beam. In other words, the common blanking mechanism specifies the irradiation time (exposure time). That is, it is controlled such that the common amplifier and the deflector 212 specify the irradiation time by using the counter 52 (irradiation time control unit). On the other hand, in the case where the common amplifier becomes ON when the individual amplifier 1 is OFF, after the individual amplifier 1 becomes OFF and the settling time S2 of the individual amplifier 1 at the time of switching from ON to OFF has passed, the common amplifier becomes ON. Thereby, beam irradiation at an unstable voltage at the time of fall of the individual amplifier 1 can be avoided. As illustrated in FIG. 9, if the operation of the individual amplifier starts after the common amplifier is turned off, an unstable operation can be avoided and accurate beam irradiation can be performed.

As described above, in the individual beam ON/OFF switching step (S116), beam ON/OFF control is individually performed for a corresponding beam in multi-beams by a plurality of individual blanking mechanisms 47 (blanking plate 204, etc.), and, for each beam, with respect to the irradiation step (irradiation) of the k-th digit (k-th bit), beam ON/OFF switching is performed by the individual blanking mechanism for the beam concerned. In the example of FIG. 9, since the beam is not in the OFF state in the irradiation step of the (k-1)th digit ((k-1)th bit), switching from ON to OFF is not performed. However, for example, if the beam is in the OFF state in the irradiation step of the (k-1)th digit ((k-1)th bit), it should be understood that switching from ON to OFF is performed.

In the common beam ON/OFF switching step (S118), for each beam, with respect to the divided irradiation step (irradiation) of the k-th digit (k-th bit), beam ON/OFF controlling is collectively performed for the entire multi beams by the common blanking mechanism 214 and the logic circuit 132, in addition to performing beam ON/OFF switching for each beam by the individual blanking mechanism, and blanking control is performed so that the beam may be in the ON state during the irradiation time corresponding to the irradiation step (irradiation) of the k-th digit (k-th bit).

As described above, since there is a restriction on the installation area of the circuit and the current to be used in the circuit in the blanking plate 204, a simple amplifier circuit is used. Therefore, it is also limited in reducing the settling time of the individual amplifier. By contrast, in the logic circuit 132 for the common blanking mechanism 214, a highly precise amplifier circuit of sufficient size, current, and scale can be installed outside the electron optical column. Therefore, the settling time of the common amplifier 54 can be shortened. Thus, according to the first embodiment, by letting the beam be ON by the common blanking mechanism 214 after the beam becomes in the ON state by the individual blanking mechanism 47 (or after a read signal of a target digit is output) and after the settling time has passed, it becomes possible to eliminate a voltage unstable time and a noise component containing crosstalk of the individual amplifier on the blanking plate and to perform a blanking operation based on a highly precise irradiation time.

In the determination step (S120), a writing control unit (not shown) in the control computer 110 determines whether transmission of irradiation time arrangement data with respect to all the digits has been completed or not. When it has not been completed yet, it proceeds to the digit change step (S122). When it has been completed, it proceeds to the determination step (S124).

In the digit change step (S122), the writing control unit (not shown) in the control computer changes a target bit (digit). For example, the target digit is changed to the (k-1)th digit ((k-1)th bit) from the k-th digit (k-th bit). Then, it returns to the target digit data transmission step (S112). With respect to the processing of the (k-1)th digit ((k-1)th bit), the steps from the target digit data transmission step (S112) to the digit change step (S122) are executed. Then, it is similarly repeated until processing of irradiation time arrangement data with respect to all the digits has been completed in the determination step (S120).

In the case of FIG. 9, after the beam ON time for the irradiation step of the k-th digit (k-th bit) has passed, a read signal of the (k-1)th digit ((k-1)th bit) is input into the register 42. In the register 42, as to the beam 1, since the data of the (k-1)th digit ((k-1)th bit) is "1", it is continued to output an ON signal. Therefore, the output of the individual amplifier 1 becomes ON, and an ON voltage is applied to the electrode 24 for individual blanking. Similarly, after the settling time of the individual amplifier 1 has passed, the beam is turned ON by the common blanking mechanism. Then, after the irradiation time of the (k-1)th digit ((k-1)th bit) has passed, the beam is turned OFF by the common blanking mechanism.

Next, after the beam ON time for the irradiation step of the (k-1)th digit ((k-1)th bit) has passed, a read signal of the (k-2)th digit ((k-2)th bit) is input into the register 42. In the register 42, as to the beam 1, since the data of the (k-2)th digit ((k-2)th bit) is "0", it is switched to output an OFF signal. Therefore, the output of the individual amplifier 1 becomes OFF, and an OFF voltage is applied to the electrode 24 for individual blanking. Similarly, after the settling time of the individual amplifier 1 has passed, the beam is turned ON by the common blanking mechanism. However, since the output of the individual amplifier 1 is OFF, consequently, the beam 1 becomes OFF. Then, after the irradiation time of the (k-2)th digit ((k-2)th bit) has passed, the beam is turned OFF by the common blanking mechanism.

Next, after the beam ON time for the irradiation step of the (k-2)th digit ((k-2)th bit) has passed, a read signal of the (k-3)th digit ((k-3)th bit) is input into the register 42. In the register 42, as to the beam 1, since the data of the (k-3)th digit ((k-3)th bit) is "1", it is switched to output an ON signal. Therefore, the output of the individual amplifier 1 becomes ON, and an ON voltage is applied to the electrode 24 for individual blanking. Similarly, after the settling time of the individual amplifier 1 has passed, the beam is turned ON by the common blanking mechanism. This time, since the output of the individual amplifier 1 is ON, consequently, the beam 1 is ON. Then, after the irradiation time of the (k-3)th digit ((k-3)th bit) has passed, the beam is turned OFF by the common blanking mechanism.

As described above, with respect to each time irradiation of irradiation performed the number of times equal to the number of digits (irradiation steps performed the number of times equal to the number of digits), for each beam in multi-beams, beam ON/OFF switching is performed by the individual blanking mechanism for the beam concerned by using a plurality of individual blanking mechanisms that individually perform beam ON/OFF control of a corresponding beam in the multi-beams simultaneously, with respect to each time irradiation of irradiation performed the number of times equal to the number of digits (irradiation steps performed the number of times equal to the number of digits), in addition to performing beam ON/OFF switching for each beam by the individual blanking mechanism, blanking control is performed so that the state of the beam may be ON during the irradiation time corresponding to irradiation of the digit concerned by using the common blanking mechanism that collectively performs beam ON/OFF control for the entire multi-beams. By the switching operation of the individual blanking mechanism and the common blanking mechanism, a beam of the irradiation time corresponding to each digit irradiates the target object 101 in order.

The electron beam 200 emitted from the electron gun 201 (emitter) almost perpendicularly illuminates the whole of the multi-beam forming plate 203 by the illumination lens 202. A plurality of holes (openings), each being a quadrangle, are formed in the multi-beam forming plate 203. The region including all the plurality of holes is irradiated by the electron beam 200. For example, a plurality of quadrangular electron beams (multi-beams) 20a to 20e are formed by letting parts of the electron beam 200 irradiating the positions of a plurality of holes individually pass through a corresponding hole of a plurality of holes of the multi-beam forming plate 203. The multi-beams 20a to 20e individually pass through a corresponding electrode group (control electrode 24, counter electrode 26: blanker) of the blanking plate 204. Each blanker deflects (performs blanking deflection) the electron beam 20 passing individually.

The multi-beams 20a, 20b, . . . , 20e having passed through the blanking plate 204 are reduced by the reducing lens 205, and go toward the hole in the center of the limiting aperture member 206. At this stage, the electron beam 20 which was deflected by the blanker of the blanking plate 204 deviates from the hole in the center of the limiting aperture member 206 (blanking aperture member) and is blocked by the limiting aperture member 206. On the other hand, if the electron beam 20 which was not deflected by the blanker of the blanking plate 204 is not deflected by the common blanking mechanism 214, it passes through the hole in the center of the limiting aperture member 206, as shown in FIG. 1. Blanking control is performed by combination of ON/OFF of the individual blanking mechanism 47 and ON/OFF of the common blanking mechanism 214 so as to control ON/OFF of the beam. Thus, the limiting aperture member 206 blocks each beam which was deflected to be a beam OFF state by at least one of the individual blanking mechanism 47 and the common blanking mechanism 214. Then, a beam of an irradiation step obtained by dividing one beam shot is formed by a beam having been made during from a beam ON state to a beam OFF state and having passed through the limiting aperture member 206. The multi beams 20 having passed through the limiting aperture member 206 are focused by the objective lens 207 in order to be a pattern image of a desired reduction ratio, and respective beams (the entire multi beams 20) having passed through the limiting aperture member 206 are collectively deflected in the same direction by the deflector 208 so as to irradiate respective irradiation positions on the target object 101. While the XY stage 105 is continuously moving, controlling is performed by the deflector 208 so that irradiation positions of beams may follow the movement of the XY stage 105, for example. Ideally, multi beams 20 to irradiate at a time are aligned at pitches obtained by multiplying the arrangement pitch of a plurality of holes of the multi-beam forming plate 203 by a desired reduction ratio described above. The writing apparatus 100 performs a writing operation by the raster scan method which continuously irradiates shot beams in order, and when writing a desired pattern, a beam required according to a pattern is controlled to be ON by blanking control.

In the determination step (S124), the writing control unit (not shown) in the control computer 110 determines whether all the shots have been completed. If all the shots have been completed, it ends. If all the shots have not been completed yet, it returns to the gray level value N calculation step (S106), and the steps from the gray level value N calculation step (S106) to the determination step (S124) are repeated until all the shots have been completed.

Figure 10:
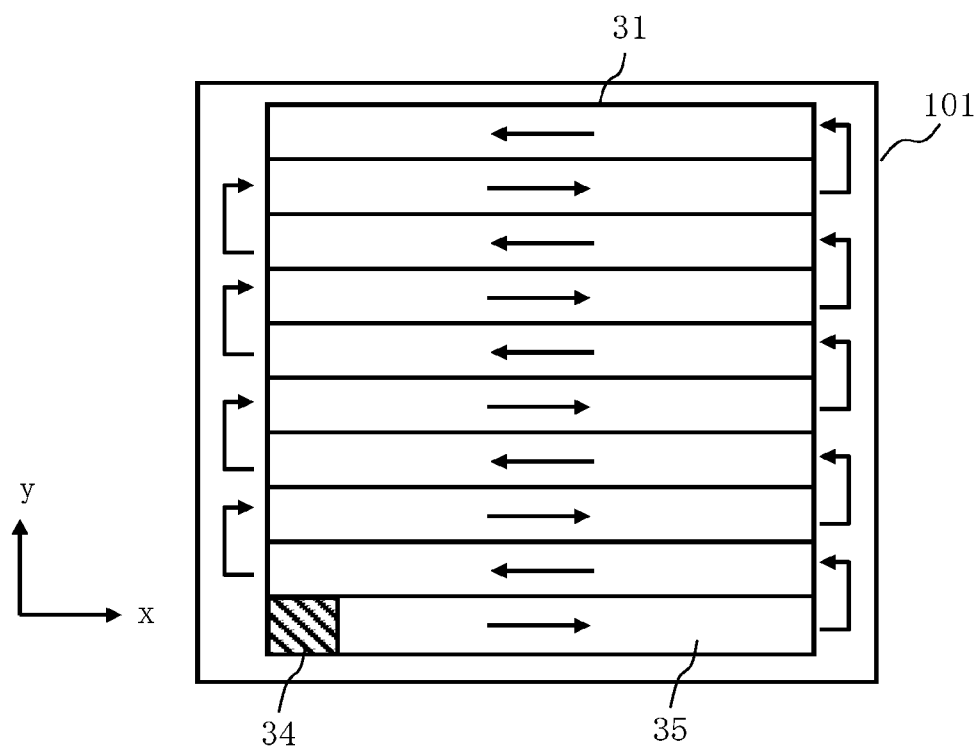
FIG. 10 is a conceptual diagram illustrating a writing operation according to the first embodiment.

FIG. 10 is a conceptual diagram illustrating a writing operation according to the first embodiment. As shown in FIG. 10, a writing region 31 of the target object 101 is virtually divided into a plurality of strip-shaped stripe regions 35 each having a predetermined width in the y direction, for example. Each of the stripe regions 35 serves as a writing unit region. The XY stage 105 is moved and adjusted such that an irradiation region 34 to be irradiated by one-time irradiation of the multi-beams 20 is located at the left end of the first stripe region 35 or at a position more left than the left end, and then writing is started. When writing the first stripe region 35, the writing advances relatively in the x direction by moving the XY stage 105 in the −x direction, for example. The XY stage 105 is continuously moved at a predetermined speed, for example. After writing the first stripe region 35, the stage position is moved in the −y direction and adjusted such that the irradiation region 34 is located at the right end of the second stripe region 35 or at a position more right than the right end and located to be relatively in the y direction. Then, similarly, writing advances in the −x direction by moving the XY stage 105 in the x direction, for example. That is, writing is performed while alternately changing the direction, such as performing writing in the x direction in the third stripe region 35, and in the −x direction in the fourth stripe region 35, and thus, the writing time can be reduced. However, the writing operation is not limited to the case of performing writing while alternately changing the direction, and it is also acceptable to perform writing in the same direction when writing each stripe region 35. By one shot, a plurality of shot patterns of the same number as the holes 22 are formed at a time by multi beams which have been formed by passing through respective corresponding holes 22 of the aperture member 203.

Figure 11:
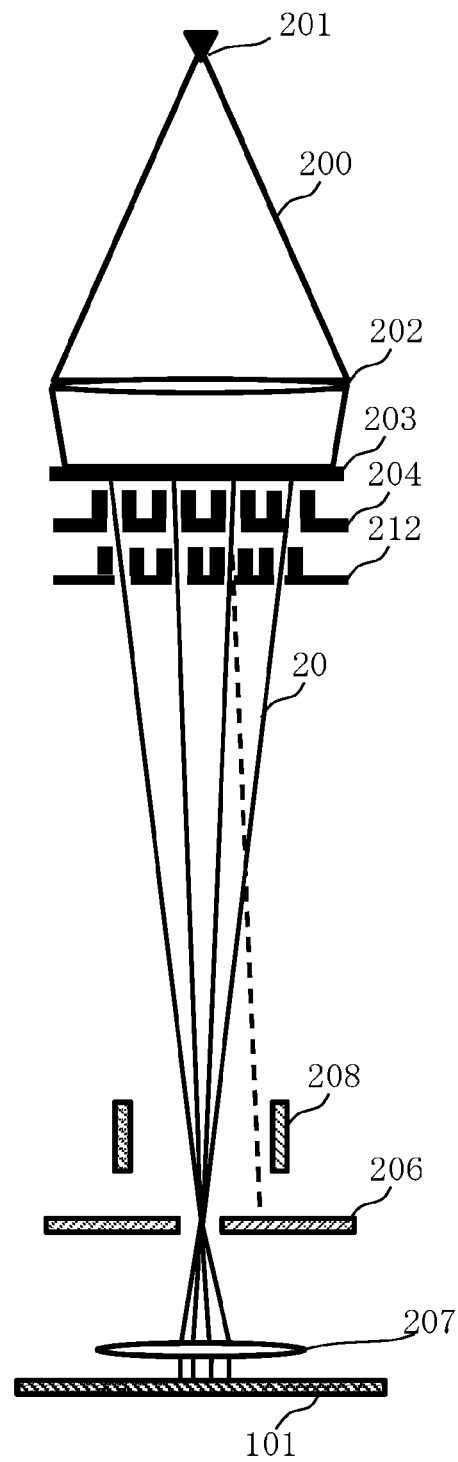
FIG. 11 shows a part of a structure of a modified example of a writing apparatus according to the first embodiment.

FIG. 11 shows a part of a structure of a modified example of the writing apparatus according to the first embodiment. In the example described above as shown in FIG. 1, the reduction optical system is configured by the reducing lens 205 and the objective lens 207. Therefore, the electron beam 200 emitted from the electron gun 201 (emitter) almost perpendicularly illuminates the whole of the multi-beam forming plate 203 by the illumination lens 202, it is not limited thereto. In the case of FIG. 11, the reduction optical system is configured by the illumination lens 202, and the objective lens 207, without using the reducing lens 205. In such a case, the electron beam 200 emitted from the electron gun 201 (emitter) is converged by the illumination lens 202 such that a crossover is formed at the hole in the center of the limiting aperture member 206, so as to illuminate the whole of the multi-beam forming plate 203. Therefore, each of the multi-beams formed by the multi-beam forming plate 203 advances with an angle toward the hole in the center of the limiting aperture member 206. Accordingly, the diameter of the entire multi-beams 20 gradually becomes smaller, from the time of passing through the multi-beam forming plate 203. Therefore, when passing through the individual blanking plate 204, the pitch of the beam becomes narrow compared with that of one of multi-beams formed by the multi-beam forming plate 203. Then, when passing through the common blanking plate 212, the pitch is further narrower. Therefore, in the structure shown in FIG. 11, the electrode groups each composed of the control electrode 440 and the counter electrode 460 mounted on the common blanking plate 212 are arrayed such that the array pitch of the electrode groups is smaller than the beam pitch of the multi-beams 20.

The electron beam 20 having been deflected by the individual blanking mechanism 47 of the individual blanking plate 204 or/and by the common blanking mechanism 214 of the common blanking plate 212 deviates from the hole in the center of the limiting aperture member 206, and is blocked by the limiting aperture member 206. On the other hand, the electron beam 20 not having been deflected by the individual blanking mechanism 47 of the individual blanking plate 204 nor by the common blanking mechanism 214 of the common blanking plate 212 passes through the hole in the center of the limiting aperture member 206. Blanking control is performed by combination of ON/OFF of the individual blanking mechanism and ON/OFF of the common blanking mechanism 214 so as to control ON/OFF of the beam. The multi beams 20 having passed through the limiting aperture member 206 are focused by the objective lens 207 in order to be a pattern image of a desired reduction ratio, and respective beams (the entire multi beams 20) having passed through the limiting aperture member 206 are collectively deflected in the same direction by the deflector 208 so as to irradiate respective irradiation positions on the target object 101. In the example of FIG. 11, the deflector 208 is arranged at the upstream of the optical path than the limiting aperture member 206, but it may be arranged at the downstream. When the deflector 208 is arranged at the upstream of the optical path than the limiting aperture member 206, it goes without saying that the amount of deflection is restricted to an amount such that ON-beams can pass through the hole in the center of the limiting aperture member 206.

As described above, according to the first embodiment, the precision of irradiation time control, and further, the precision of dose control can be improved while maintaining the restriction on a circuit installation space. Moreover, since the logic circuit 41 of the individual blanking mechanism has a data amount of 1 bit, power consumption can be suppressed. Moreover, according to the first embodiment, since the distance between the control electrode 440 and the counter electrode 460 of the common blanking mechanism 214 is set to be short, the settling time can be shortened and a high-speed deflection can be performed.

Thus, according to the first embodiment, multi beams can be deflected at high speed, and therefore, writing can be performed highly precisely.

Embodiments have been explained referring to concrete examples described above. However, the present invention is not limited to these specific examples. Although the logic circuit 132 for common blanking is arranged outside the electron optical column 102 according to the first embodiment, it is also preferable to arrange the logic circuit 132 for common blanking inside the electron optical column 102 or to incorporate the logic circuit 132 by fabricating the common blanking plate 212 as a semiconductor substrate.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other blanking device for multi charged particle beams, and multi charged particle beams writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A blanking device for multi charged particle beams comprising:
    a plurality of individual blanking mechanisms configured to individually deflect a corresponding beam of multi charged particle beams so as to control ON/OFF of the corresponding beam; and
    a common blanking mechanism configured to include a plurality of electrode groups, each composed of facing electrodes, where an array pitch of the plurality of electrode groups is smaller than or equal to a pitch of the multi charged particle beams, and to collectively deflect the multi charged particle beams in order to control an exposure time,
    wherein each of the plurality of electrode groups includes a control electrode and a counter electrode which is grounded,
    the whole control electrodes of the plurality of electrode groups are arranged to be electrically connected with each other,
    the whole counter electrodes of the plurality of electrode groups are arranged to be electrically connected with each other, and
    the common blanking mechanism includes a common amplifier which outputs an ON voltage to be collectively applied to the whole control electrodes electrically connected with each other to control the exposure time.

2. The device according to claim 1, wherein
    the multi charged particle beams are arranged in two dimensions in a matrix on a plane perpendicular to an irradiation direction, and
    one of the plurality of electrode groups is arranged for each row or column of the multi charged particle beams.

3. The device according to claim 1, wherein
    the common blanking mechanism is arranged in a vacuum during operation, further comprising
    a drive amplifier, arranged in an atmosphere during the operation, configured to drive the common blanking mechanism.

4. The device according to claim 1, wherein
    the common blanking mechanism includes a plate where a plurality of openings which are in two dimensions in a matrix and through each of which a corresponding one of the multi charged particle beams passes are formed, and
    each of the plurality of electrode groups is arranged for each row or column of the plurality of openings such that electrodes in the each of the plurality of electrode groups sandwich the each row or column concerned.

5. The device according to claim 4, wherein
    the control electrode is arranged for the each row or column of the plurality of openings, and the counter electrode is arranged for the each row or column of the plurality of openings.

6. The device according to claim 5, wherein one of the plurality of electrode groups, each composed of the control electrode and the counter electrode, collectively deflects beams, in the multi charged particle beams, which pass through the each row or column of the plurality of openings.

7. A multi charged particle beam writing apparatus comprising:
- a stage configured to mount a target object thereon and to be continuously movable;
- an emitter configured to emit a charged particle beam;
- an aperture member, in which a plurality of openings are formed, configured to form multi beams by making a region including a whole of the plurality of openings irradiated by the charged particle beam and by letting portions of the charged particle beam individually pass through a corresponding one of the plurality of openings;
- a plurality of individual blanking mechanisms configured to individually deflect a corresponding beam of the multi beams in order to control ON/OFF the corresponding beam;
- a common blanking mechanism configured to include a plurality of electrode groups, each composed of facing electrodes, where an array pitch of the plurality of electrode groups is smaller than or equal to a pitch of the multi beams, and to collectively deflect the multi beams in order to control an exposure time; and
- a limiting aperture member configured to block each beam having been deflected to be in an off state by at least one of the plurality of individual blanking mechanisms and the common blanking mechanism, wherein each of the plurality of electrode groups includes a control electrode and a counter electrode which is grounded, the whole control electrodes of the plurality of electrode groups are arranged to be electrically connected with each other, the whole counter electrodes of the plurality of electrode groups are arranged to be electrically connected with each other, and the common blanking mechanism includes a common amplifier which outputs an ON voltage to be collectively applied to the whole control electrodes electrically connected with each other to control the exposure time.

8. The apparatus according to claim 7, wherein the common blanking mechanism is arranged between the plurality of individual blanking mechanisms and the limiting aperture member.

* * * * *